United States Patent [19]

Green et al.

[11] Patent Number: 5,166,639
[45] Date of Patent: Nov. 24, 1992

[54] HIGH GAIN MOLOLITHIC MICROWAVE INTEGRATED CIRCUIT AMPLIFIER

[75] Inventors: Ronald P. Green, Warrington, Pa.; David M. Osika, Somerville, N.J.

[73] Assignee: SGS-Thomson Microelectronics, Inc., Carrollton, Tex.

[21] Appl. No.: 784,260

[22] Filed: Oct. 29, 1991

[51] Int. Cl.$^5$ .............................. H03F 1/34
[52] U.S. Cl. ........................ 330/294; 330/99; 330/306
[58] Field of Search .......... 330/98, 99, 100, 103, 330/109, 150, 286, 294, 302, 306, 307, 310

[56] References Cited

U.S. PATENT DOCUMENTS

| | | | |
|---|---|---|---|
| 3,474,349 | 10/1969 | Ellermeyer | 330/99 |
| 4,189,681 | 2/1980 | Lawson et al. | 330/294 X |
| 4,275,453 | 6/1981 | Wagner | 330/294 X |
| 4,290,027 | 9/1981 | Parker | 330/306 X |

Primary Examiner—Steven Mottola
Attorney, Agent, or Firm—Allan Ratner; Lisa K. Jorgenson; Richard K. Robinson

[57] ABSTRACT

Linear high gain (greater than 20 dB) and high power (greater than +20 dbm) devices for RF power amplifiers are achieved using either fully monolithic or hybridized versions of silicon MMIC two-stage cascaded amplifiers. The device features three feedback loops in conjunction with a DC biasing network. Resistor-capacitor feedback circuits utilize only two capacitive elements which are provided as a single three-terminal element having a common lower plate.

8 Claims, 3 Drawing Sheets

HIGH GAIN MOLOLITHIC MICROWAVE INTEGRATED CIRCUIT AMPLIFIER

BACKGROUND OF THE INVENTION

The present invention concerns an integrated circuit microwave amplifier and in particular, a monolithic microwave integrated circuit amplifier having a novel feedback network.

Monolithic microwave integrated circuits, hereinafter referred to as MMIC, are useful in mobile cellular radio and personal communication systems. Such systems require a silicon MMIC device having 50 ohm input and output impedance which can produce a power level of least +20 dBm in order to directly drive a power amplifier stage. Additionally, the device should itself be capable of being driven by a driver device with a low noise figure at high frequencies, typically 900 MHz. Such a driver may only be capable of an output power of about 1 mW (i.e., 0 dBm) due to the noise constraint. Accordingly, there is a need for a MMIC device which is characterized by greater than 20 dB gain and greater than 20 dBm output power.

Single stage amplifiers known in the art suffer from gain limitations. One approach to overcome these limitations is to employ a second stage of amplification in conjunction with a resistor-capacitor feedback combination to match the impedances of the input and output stages. A problem with this approach is that reactive elements such as capacitors may limit the useful band width of the amplifier. Accordingly, there is a need to provide a cascaded broad band amplifier with the least number of reactive feedback elements. Moreover, the requirements for monolithic implementation, small size, efficient packaging and ease of manufacture further restrict the number of capacitive elements. Therefore, there is also a need for a broadband cascaded amplifier utilizing the least number of capacitive elements.

Accordingly, it is an objective of this invention is broadband amplifier device characterized by a gain of greater than 20 dB and an output power of greater than +20 dBm, capable of being implemented in a monolithic integrated circuit.

A further object of this invention is a broadband cascaded amplifier with the least number of capacitor feedback elements to provide for broad frequency response, monolithic implementation, ease of manufacture and efficient packaging.

SUMMARY OF THE INVENTION

The present invention is embodied in a linear, high gain silicon MMIC amplifier circuit for use in RF power circuits. The circuit includes a two-stage cascaded broadband amplifier comprising first and second Darlington transistor stages and at least two feedback loops. The output of the first Darlington stage is connected to the input of the second stage through a blocking capacitor. A resistor-capacitor combination comprising a feedback capacitor and a first feedback resistor form a first feedback path from the output terminal of the first stage to the input terminal of the first stage. A second feedback path from the output terminal of the second stage to the input terminal of the second stage is provided by a network which includes a second feedback resistor, the feedback capacitor and the blocking capacitor.

According to another aspect of the invention, a third feedback path is provided, from the output terminal of the second stage to the input terminal of the first stage, by the first and second feedback resistors.

According to another aspect of the invention, the feedback capacitor and the blocking capacitor are implemented as a three-terminal device having a split upper plate and a common lower plate.

DETAILED DESCRIPTION OF THE INVENTION

Figure 1:
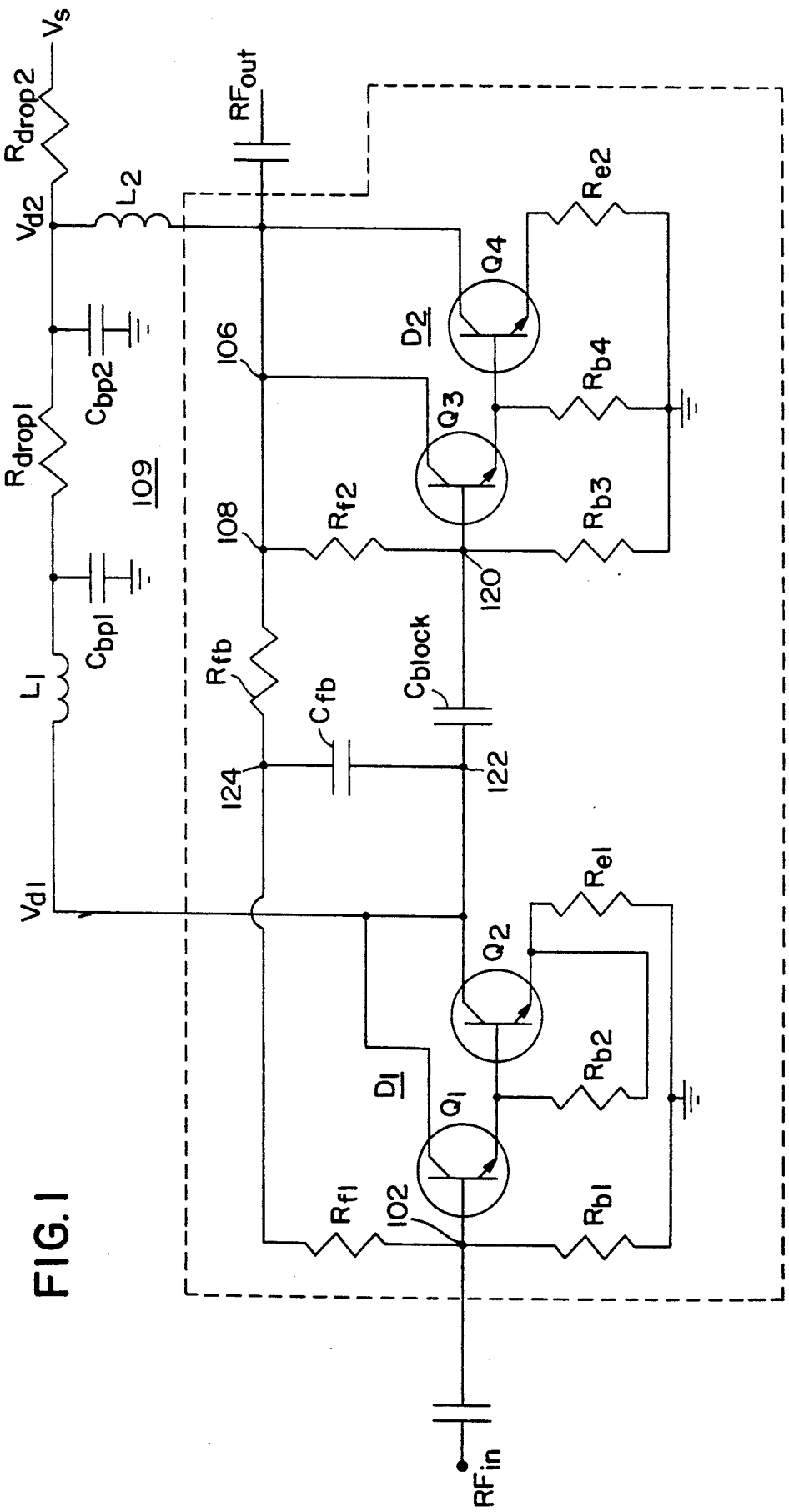
FIG. 1 is an electrical schematic diagram of a two-stage broadband amplifier in accordance with the teachings of this invention.

Referring to FIG. 1, a two-stage amplifier A in accordance with the teachings of this invention comprises a first Darlington transistor pair, D1 (Transistors Q1 and Q2), functioning as a first amplifier stage and a second Darlington transistor pair, D2 (Transistor Q3 and Q4) functioning as a second amplifier stage. Since a Darlington transistor pair has characteristics resembling as a single transistor, it is commonly referred to as a Darlington Transistor. The output of the first Darlington transistor, D1, is AC coupled to the input of the second Darlington transistor, D2, through capacitor Cblock.

A resistor-capacitor combination comprising capacitor Cfb and resistor Rf1 form a first feedback network connecting the output terminal of transistor Q2 to the input terminal of transistor Q1. A second feedback network between the output terminal of transistor Q4 and the input terminal of transistor Q3 is provided by series connected resistor Rfb, capacitor Cfb and capacitor Cblock coupled in parallel with a feedback resistor Rf2. A third feedback network from the output terminal of transistor Q4 to the input terminal of transistor Q1 is provided by the series connected resistors Rfb and Rf1. This third feedback network provides for additional flatness of overall response.

In a conventional amplifier of this type, each stage would have a resistor-capacitor feedback network coupling its output terminal to its input terminal. In addition, the amplifier would include a blocking capacitor to AC couple the output signal from the first stage to the input terminal of the second stage. The quiescent operation point of the amplifier would be set by a biasing network which would include the feedback resistors as well as resistors such as Rb1, Rb2, Rb3, Rb4, Re1 and Re2, shown in FIG. 1.

Thus, in accord with the objectives of this invention, the number of capacitors needed to provide a DC block between stages and feedback loops for each stage is reduced from three to two. The values of the feedback resistor-capacitor elements are selected to provide for flatness of response and a suitable DC bias for the Darlington transistors D1 and D2.

Values of 30 picofarad for both Cfb and Cblock. 250 ohm for Rfb and 900 ohm for Rf1 have been found suitable for operation up to about 1 Ghz when used in conjunction with Darlington transistors D1 and D2 having the characteristics of commercially available silicon MMIC's such as, for example, amplifier model nos. AMP 11 and AMP 5 which are available from SGS-Thomson Microelectronics of Montgomeryville, Pa. Exemplary values of the remaining components of the circuit are given in a table at the end of the specification.

Referring again to FIG. 1, power supply circuit 109 comprising a voltage source Vs, resistors Rdrop1 and Rdrop2, capacitors Cbp1 and Cbp2, and AC chokes L1 and L2, supplies a constant current to the Darlington transistors D1 and D2, provides isolation between the amplifier stages and additionally provides a load impedance for the Darlington transistors D1 and D2 in the frequency band of interest.

Figure 2:
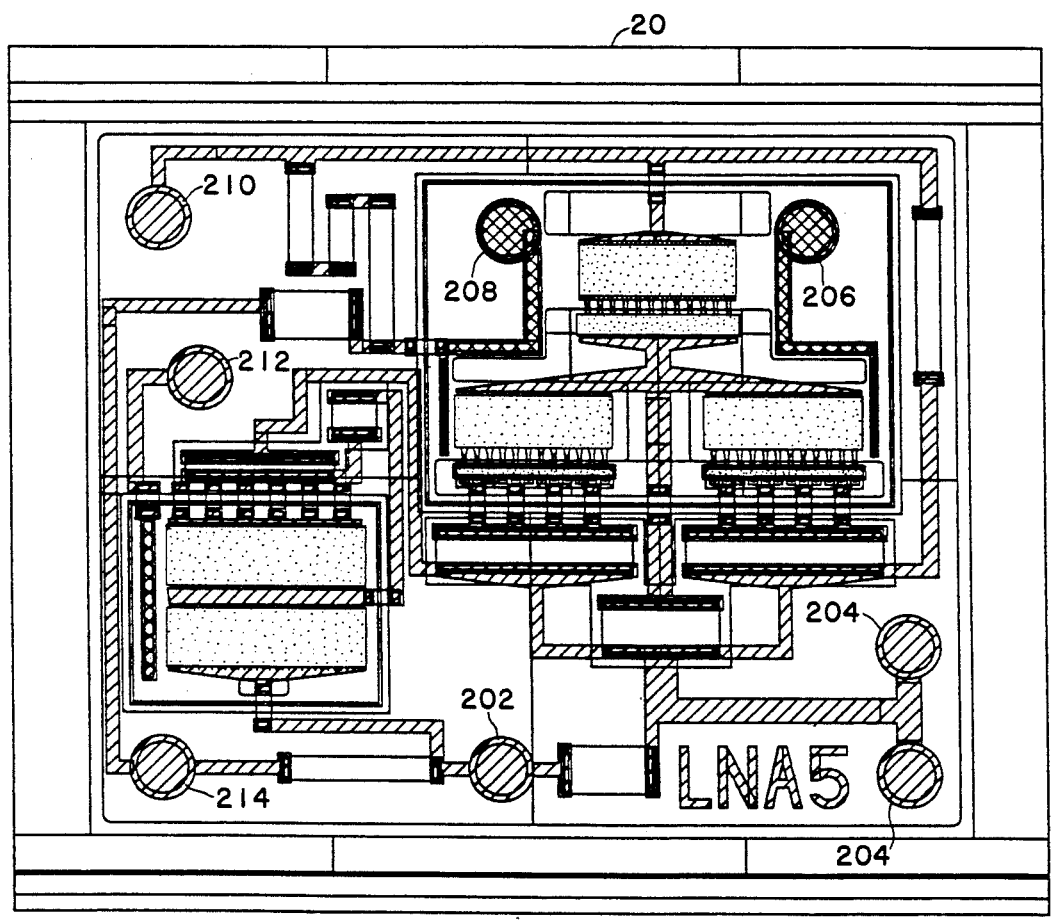
FIG. 2 is a plan view of the topography of a two-stage broadband amplifier in accordance with teachings of this invention.

FIG. 2 illustrates the topography of a hybrid device component 20 which includes the amplifier stages and resistive elements, but not the capacitors Cfb and Cblock, in a single structure. The illustrated device has provisions for connecting to a separate die containing the capacitors Cfb and Cblock. Contact pad 202 is the input terminal of the device and corresponds to connection point 102 in FIG. 1. Contact pads 204 are ground leads. Pad 206 is the output terminal, corresponding to connection point 106 in FIG. 1. Pad 208 provides contact for power supply voltage Vd2 at connection point 108 on FIG. 1. Pad 210 provides connection both to Cblock and to the input terminal of Q3 at connection point 120 of FIG. 1. Pad 212 provides common connection to capacitors Cblock and Cfb and for the power supply to the first Darlington transistor D1 at connection point 122 in FIG. 1. Pad 214 provides contact to feedback capacitor Cfb at connection point 124 on FIG. 1.

Thus, FIG. 2 illustrates an additional feature of this invention, namely, only three connections to the capacitors are needed instead of the six that are conventional in the art (i.e. when two feedback capacitors and one blocking capacitor are used), thereby facilitating the manufacture of both hybrid structures, such as that shown in FIG. 2, and fully monolithic structures, which are contemplated by this invention.

The invention further contemplates a planar three terminal device which forms the two capacitors Cfb and Cblock. The device has a common lower plate corresponding to the connected ends of the capacitors Cfb and Cblock, and a split upper plate corresponding to the respective other ends of the two capacitors. A single contact connects the lower plate of the capacitors to the amplifier circuit and separate connections are made to each top plate. The connection to the bottom plate is made at the top surface of the die by utilizing the ground bar technique to access the substrate, i.e. lower surface of the capacitor, for the common contact.

Figure 3:
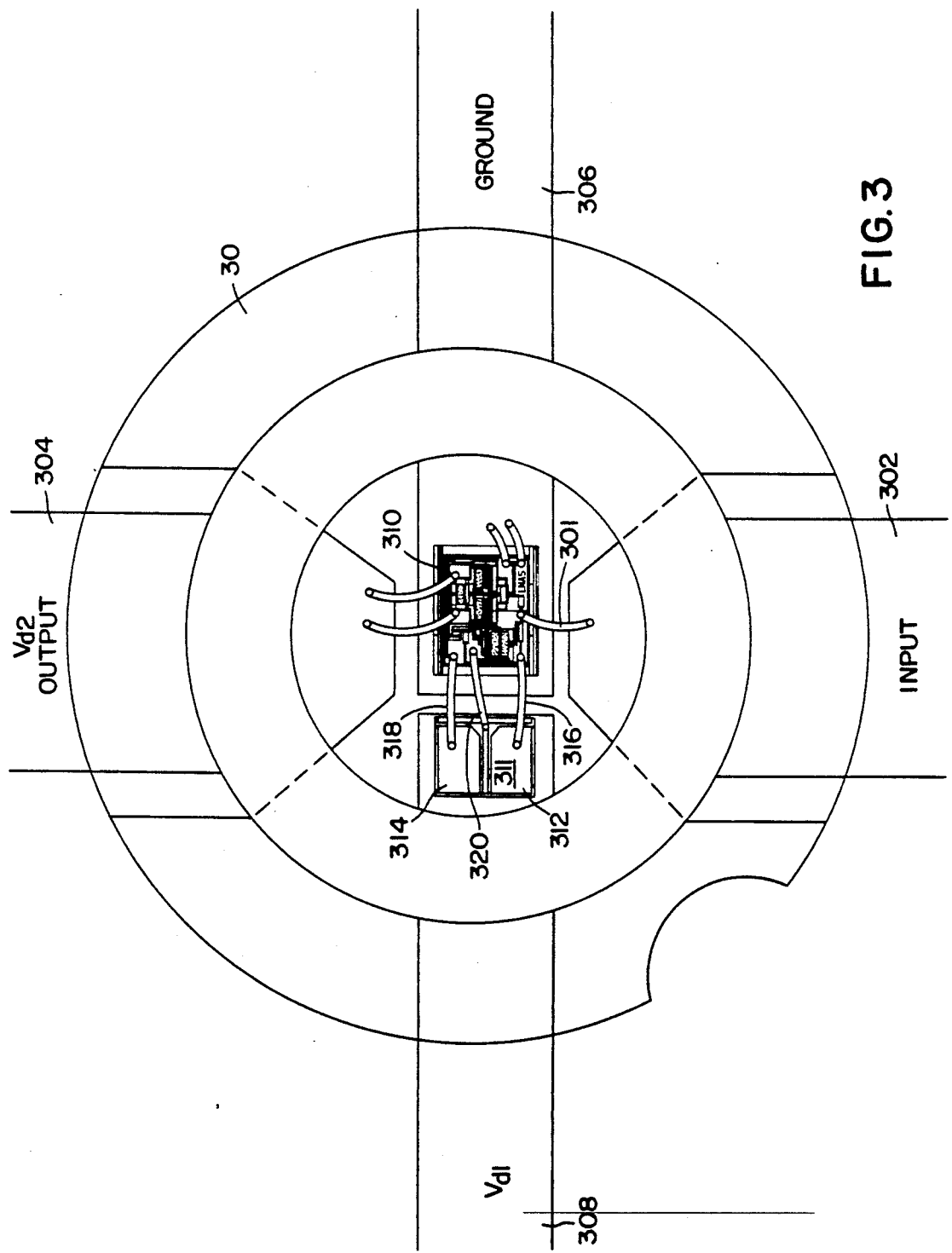
FIG. 3 is a plan view of a two-stage broadband amplifier mounted in a package.

FIG. 3 illustrates in plan view a complete hybrid device in accord with the teachings of this invention mounted in low cost, studded screen metalized BeO package to provide a suitable heat sink. Package 30 includes four external leads providing for input 302, output 304, ground 306 and an optional second D.C. power connection 308. Mounted within package 30 is MMIC die 310, corresponding to 20 in FIG. 2, and a capacitor die 311. Referring to FIGS. 1, 2 and 3, internal lead 301 connects external input lead 302 (FIG. 3) to contact pad 202 (FIG. 2) at connection point 102 (FIG. 1). Similar connections between external leads (FIG. 3), contact pads (FIG. 2) and connection points (FIG. 1) are evident from Figures. In particular, lead 316 connects one top plate, corresponding to capacitor 312 (Cfb in FIG. 1) to contact pad 214 and connecting point 124; lead 318 connects the other top plate, corresponding to capacitor 314 (Cblock in FIG. 1) to contact pad 210 at connection point 120; and lead 320 connects the common lower plate of the capacitors on capacitor die 311 to contact pad 212 at connection point 122. Optionally, the three terminal device 311 including capacitors Cfb (312) and Cblock (314) may be fabricated on the same chip with amplifier 20 in complete monolithic fashion, thereby eliminating the need for the separate capacitor die 311 and internal leads 316, 318 and 320 in package 30.

Fabrication of fully monolithic silicon MMIC's in accord with the teachings of this invention is preferably accomplished by combining all circuit elements with the active device structure using a fully ion implanted fabrication sequence which is incorporated into a fine line interdigitated transistor structure for transistors Q1 through Q4.

Processing procedures known in the art use 1.0 micron metal fingers and spaces which produce a device having a 4.0 micron emitter to emitter pitch. Fine line emitter and base openings less than one-half micron result in low emitter base junction capacitance and therefore higher frequency operation. Utilization of these structures leads to a high packing density and an (emitter periphery)-to-(base area) ratio of 0.43 micron-1. Such a high ratio indicates an associated low collector base junction capacity for the required emitter periphery.

The resistors of the MMIC amplifier 20 (shown in FIG. 2) are fabricated preferably using ion implanted LPCVD polysilicon with precisely controlled values. Additionally, fabrication of resistors with different resistivity characteristics is achieved with selective implantation.

Optionally, thin metal films may be employed, although polysilicon is preferred in order to control current density through each resistor by selecting film thickness and current density. To achieve high reliability interconnects, a refractory gold metalization is preferred.

Collector isolation of silicon MMIC's in accord with the teaching of this invention is preferably achieved using trenched epitaxial structure with air bridge interconnects. The substrate is eutectically mounted to the ground plane and collector contacts for the individual n-type regions are brought to the surface. Optionally, fully planar processing can be carried out using a suitable dielectric material, such as undoped polysilicon to refill the trenches.

Exemplary component values for the circuit shown in FIGS. 1-3 are listed in the following TABLE.

TABLE

| | |
|---|---|
| Darlington transistor D1 | Model AMP 11, SGS-Thomson Microelectronics |
| Darlington transistor D2 | Model AMP 5, SGS-Thomson Microelectronics |
| Resistor Rf1 | 900 Ω |
| Resistor Rf2 | 1840 Ω |
| Resistor Rfb | 250 Ω |
| Resistor Rb1 | 320 Ω |
| Resistor Rb2 | 55 Ω |
| Resistor Rb3 | 1000 Ω |
| Resistor Rb4 | 30 Ω |
| Resistor Re1 | 6.25 Ω |
| Resistor Re2 | 9 Ω |
| Capacitors Cfb and Cblock | 30 pF |

What is claimed:

1. A monolithic microwave integrated circuit amplifier comprising:
   a first amplifier stage having an input terminal and an output terminal;
   a blocking capacitor;
   a second amplifier stage having an input terminal and an output terminal wherein the input terminal of the second amplifier stage is coupled to the output terminal of the first amplifier stage through the blocking capacitor;
   a first feedback network, having first and second terminals, including a feedback capacitor connected in series with a first feedback resistor, wherein the respective first and second terminals of the first feedback network are connected to the respective output terminal and input terminal of the first amplifier stage;
   a second feedback network, having first and second terminals, including a series connection of a second feedback resistor, the feedback capacitor and the blocking capacitor wherein the respective first and second terminals of the second feedback network are connected to the respective output terminal and input terminal of the second amplifier stage.

2. A monolithic microwave integrated circuit amplifier according to claim 1, further comprising a third feedback network including the first and second feedback resistors between the output of the second amplifier stage and the input of the first amplifier stage.

3. A monolithic microwave integrated circuit amplifier according to claim 1, wherein the second feedback network further includes a third feedback resistor coupled in between the output of the second amplifier stage and the input of the second amplifier stage.

4. A monolithic microwave integrated circuit amplifier according to claim 1 wherein the first and second amplifier stages each include a Darlington transistor pair.

5. A monolithic microwave integrated circuit amplifier according to claim 1, wherein the blocking capacitor and feedback capacitor are implemented as a single device having a common lower plate and a split upper plate, wherein separate terminals are provided for connecting to the lower plate and each of the upper plates formed by the split.

6. A monolithic microwave integrated circuit amplifier according to claim 1 wherein the blocking capacitor and the feedback capacitor are formed separately from the first and second amplifier stages and are connected to the first and second amplifier stages in a hybrid structure.

7. A monolithic microwave integrated circuit amplifier according to claim 1 wherein the feedback capacitor, the blocking capacitor and the first and second amplifier stages are formed on a single substrate in a fully monolithic structure.

8. The amplifier of claim 1 wherein the first and second amplifier stages each includes biasing resistor elements and the blocking capacitor, the feedback capacitor and the first and second feedback resistors are selected to provide for a substantially flat frequency response characteristic for the amplifier over a predetermined band of frequencies and to act with the biasing resistors to provide a predetermined DC bias to the first and second amplifier stages.

* * * * *